(12) United States Patent
Yang

(10) Patent No.: US 9,747,999 B2
(45) Date of Patent: Aug. 29, 2017

(54) COMPACT EFUSE ARRAY WITH DIFFERENT MOS SIZES ACCORDING TO PHYSICAL LOCATION IN A WORD LINE

(71) Applicants: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

(72) Inventor: Chia Chi Yang, Shanghai (CN)

(73) Assignees: Semiconductor Manufacturing International (Beijing) Corporation, Beijing (CN); Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 15/374,064

(22) Filed: Dec. 9, 2016

(65) Prior Publication Data

US 2017/0186495 A1    Jun. 29, 2017

(30) Foreign Application Priority Data

Dec. 23, 2015    (CN) .......................... 2015 1 0974772

(51) Int. Cl.
*G11C 17/16*    (2006.01)
*G11C 17/18*    (2006.01)

(52) U.S. Cl.
CPC .............. *G11C 17/16* (2013.01); *G11C 17/18* (2013.01)

(58) Field of Classification Search
CPC ..................................................... G11C 17/16
USPC ........................................................... 365/96
See application file for complete search history.

(56) References Cited

U.S. PATENT DOCUMENTS

| 7,405,590 | B1 * | 7/2008 | Kaneko | G11C 17/16 |
| | | | | 326/30 |
| 7,701,226 | B2 * | 4/2010 | Kaneko | G01R 31/07 |
| | | | | 257/529 |
| 8,611,144 | B2 * | 12/2013 | Terzioglu | G11C 17/18 |
| | | | | 365/158 |
| 8,760,955 | B2 * | 6/2014 | Liao | G11C 17/16 |
| | | | | 365/148 |
| 9,418,763 | B2 * | 8/2016 | Huang | G11C 29/787 |

(Continued)

OTHER PUBLICATIONS

European Application No. 16204643.7, Extended European Search Report, dated Jun. 6, 2017, 5 pages.

*Primary Examiner* — Son Mai
(74) *Attorney, Agent, or Firm* — Kilpatrick Townsend & Stockton LLP

(57) ABSTRACT

A array of electrically programmable fuse (eFuse) units includes at least one connecting switch connecting two adjacent eFuse units. Each eFuse unit includes an eFuse, a write switch for passing through a first portion of a write current, a read/write switch for passing through a second portion of the write current or a read current, and a common node. The eFuse, the write switch, the read/write switch, and the at least one connecting switch are connected to each other at the common node. By turning on and off the at least one connecting switch, the current is split among the eFuse units, so that the size of the write switch can be reduced, thus reducing the total area of the array.

15 Claims, 6 Drawing Sheets

(56) References Cited

U.S. PATENT DOCUMENTS

2006/0197178 A1     9/2006   Chung
2011/0317468 A1*   12/2011   Terzioglu ............... G11C 17/18
                                                                         365/96
2013/0039117 A1     2/2013   Lin et al.

* cited by examiner

COMPACT EFUSE ARRAY WITH DIFFERENT MOS SIZES ACCORDING TO PHYSICAL LOCATION IN A WORD LINE

CROSS-REFERENCES TO RELATED APPLICATIONS

This application claims priority to Chinese patent application No. 201510974772.X, filed on Dec. 23, 2015, the content of which is incorporated herein by reference in its entirety.

BACKGROUND OF THE INVENTION

The present invention relates to semiconductor technology. Specifically, embodiments of the invention are directed to an electrically programmable fuse (eFuse) cell array and memory device.

In a conventional cell array of electrically programmable fuses (referred to as "eFuse" hereinafter), an eFuse unit includes an eFuse cell and a switch. In a write operation, for example, a relatively high current will flow through the eFuse to burn the eFuse for writing information to the eFuse unit. Thus, a write operation may be referred to as a fusing operation, and a write current is also referred to as a fusing current.

Since the write current is relatively high, a switch of an eFuse unit, e.g., an NMOS transistor, will be relatively large and occupies most of the area of the eFuse unit, e.g., 80% of the eFuse unit area. Furthermore, in a read operation, the current flowing through the eFuse unit is constrained by the maximum read current and the read duration, that limits the number of read operations.

FIG. 1 is a schematic diagram of a 1R2T circuit of an eFuse unit, as known in the prior art. The eFuse unit includes an electrically programmable fuse 11 having a terminal connected to a write NMOS transistor 12 and a read NMOS transistor 13. In a read operation, write NMOS transistor 12 is turned off, and read NMOS transistor 13 is turned on. In a write operation, both write NMOS transistor 12 and read NMOS transistor 13 are turned on. Since the read current is very small, such as equal to about 1% of the write current, so that the read NMOS transistor can be very small. Because the read current is reduced, it is possible to significantly increase the number of read operations. However, such structure of the eFuse unit does not significantly reduce the area comparing with the 1R1T circuit of a conventional eFuse unit, the problem of a relatively large area remains.

Thus, there is a need for a novel eFuse structure and method of manufacturing the same.

BRIEF SUMMARY OF THE INVENTION

The present invention relates to semiconductor technology. Specifically, embodiments of the invention are directed to a compact electrically programmable fuse (eFuse) cell array and method for operating the same.

Embodiments of the present invention provide an array of electrically programmable fuse (eFuse) units. The array includes a first wiring drive unit configured to provide a first wiring connected to the eFuse units, and at least one connecting switch disposed between two adjacent eFuse units. Each of the eFuse units includes an eFuse having a first terminal and a second terminal, a write switch having a first terminal, a second terminal, and a control terminal, the write switch being configured to pass through a first portion of a write current, a read/write switch having a first terminal, a second terminal, and a control terminal. The read/write switch is configured to pass through a second portion of the write current or a read current. The first terminal of the eFuse is connected to a second wiring, the second terminal of the eFuse, the first terminal of the read/write switch, and the first terminal of the write switch are connected to a common node, the second terminal of the write switch and the second terminal of the read/write switch is connected to a third wiring, the control terminal of the write switch is connected to the first wiring, and the control terminal of the read/write switch is connected to a fourth wiring. The at least one connecting switch has a control terminal connected to the first wiring, a first terminal connected to the common node of a first eFuse unit and a second terminal connected to a common node of a second eFuse of the two adjacent eFuse units.

In one embodiment, the eFuse units comprise two eFuse units, the at least one connecting switch comprises one connecting switch, and the one connecting switch is disposed between the two eFuse units.

In one embodiment, the eFuse units comprise four eFuse units, the at least one connecting switch comprises three connecting switches, and the three connecting switches are disposed alternatively between the four eFuse units.

In one embodiment, the eFuse units comprise 2N eFuse units, the at least one connecting switch comprises 2N–1 connecting switches, N is a positive integer greater than 2, and the 2N–1 connecting switches are disposed alternatively between the 2N eFuse units. In a sequence of 2N–1 connecting switches: a connecting switch at a location 2N–1 has a smallest on-resistance value, and a first connecting switch and a last connection switch each have a substantially equal on-resistance value. And connecting switches disposed between the first and last connecting switches and toward a middle of the sequence have an increasing on-resistance value, and connecting switches disposed between a 2N–1 positioned connecting switch and a 2N–1 positioned connecting switch have an increasing on-resistance value.

In one embodiment, a 2N–2 positioned connecting switch, a 2N–2+1 positioned connecting switch, a 2N–2N–2–1 positioned connecting switch, and a 2N–2N–2 positioned connecting switch, each have a largest on-resistance value.

In one embodiment, the read/write switch of each one of the eFuse units has a substantial same on-resistance value, which is greater than an on-resistance value of the write switch of each one of the eFuse units.

In one embodiment, the eFuse units comprise 2N eFuse units, and 2N write switches, each of which corresponding to one of the 2N eFuse units, N being a positive integer greater than 1. In a sequence of 2N write switches: a first write switch and a last write switch at outermost ends of the sequence each have a smallest on-resistance value, write switches each disposed between the first and last write switches and toward a middle of the sequence have an increasing on-resistance value.

In one embodiment, the eFuse units comprise four eFuse units, and the at least one connecting switch comprises three connecting switches, and the three connecting switches are disposed alternatively between the four eFuse units. In a sequence of the three connecting switches: a connecting switch in a middle of the sequence has a greatest area, the two connecting switches each disposed at an outermost end of the sequence have a substantial same area, which is smaller than an area of a connecting switch in the middle of the sequence.

In one embodiment, the eFuse units comprise 2N eFuse units, the at least one connecting switch comprises 2N−1 connecting switches, N being a positive integer greater than 2; and the 2N−1 connecting switches are disposed alternatively between the 2N eFuse units. In a sequence of 2N−1 connecting switches: a connecting switch at a location 2N−1 has a largest area, and a first connecting switch and a last connection switch at outermost ends of the sequence have a substantially equal area, connecting switches disposed between the first and last connecting switches and toward a middle of the sequence have a decreasing area, and connecting switches disposed between a 2N−1 positioned connecting switch and a 2N−1 positioned connecting switch have a decreasing area.

In one embodiment, a 2N−2 positioned connecting switch, a 2N−2+1 positioned connecting switch, a 2N−2N−2−1 positioned connecting switch, and a 2N−2N−2 positioned connecting switch each have a smallest area.

In one embodiment, each read/write switch of each one of the eFuse units has a substantial same area, which is smaller than an area of a write switch of each one of the eFuse units.

In one embodiment, the eFuse units comprise 2N eFuse units and 2N write switches, each of which corresponding to each one of the 2N eFuse units, and N is a positive integer greater than 1. In a sequence of 2N write switches: a first write switch and a last write switch at outermost ends of the sequence have a largest area, and the write switches disposed between the first and last write switches and toward a middle of the sequence each have a decreasing area.

In one embodiment, the write switch, the read/write switch, and the at least one connecting switch are NMOS transistors.

In one embodiment, the array may further include a second wiring drive unit configured to provide a read current and a write current.

Embodiments of the present invention also provide a method of operating an array of electrically programmable fuse (eFuse) units. The method may include providing the array of a plurality of eFuse units having at least one connecting switch disposed between two adjacent eFuse units, each of the eFuse units being connected to a first wiring, a second wiring, a third wiring, and a fourth wiring, and each of the eFuse units having an eFuse connected to a write switch and a read/write switch. In a write operation, the method includes applying a voltage level to the first, second, third, and fourth wirings to turn on the write switch, the read/write switch, and the at least one connecting switch, to cause a write current flowing through the eFuse of a selected eFuse unit. In a read operation, the method includes applying a voltage level to the first, second, third, and fourth wirings to turn off the write switch, turn off the at least one connecting switch, and turn on the read/write switch, to cause a read current flowing through the eFuse of the selected eFuse unit.

The following description, together with the accompanying drawings, will provide further understanding of the nature and advantages of the claimed invention.

DETAILED DESCRIPTION OF THE INVENTION

Figure 1:
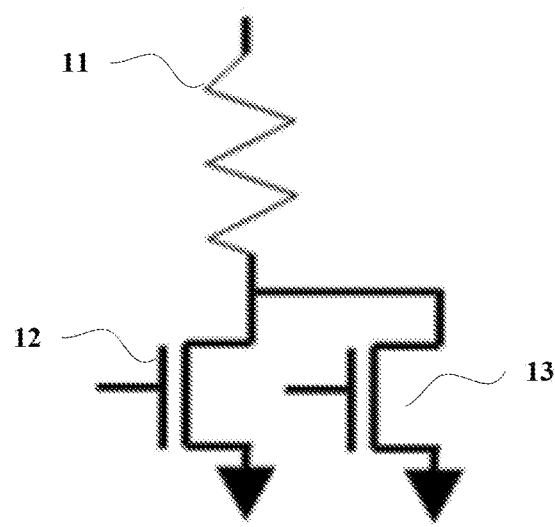
FIG. 1 is a simplified schematic circuit diagram illustrating an electrical programmable fuse, as known in the art.

Exemplary embodiments of the present invention will be described with reference to the drawings. The following description of exemplary embodiments is illustrative only, and not intended to be any limitation on the invention and its application or use. It is understood that the relative arrangement of parts and steps and numeric expressions set forth in these embodiments are not to be construed as limiting the scope of the invention. It is also understood that, for convenience of description, the size of the various components shown in the drawings are not necessarily drawn in actual proportional relationship. Techniques, methods and devices known to one of ordinary skill in the relevant art may not be discussed in detail, but in situations in which these techniques, methods and devices apply, these techniques, methods and devices should be considered as part of this specification. Further, similar reference numerals and letters are used to refer to similar items in the following figures, and once an item is defined in one of the figures, it will not need to be explained further in the subsequent figures.

Figure 2A:
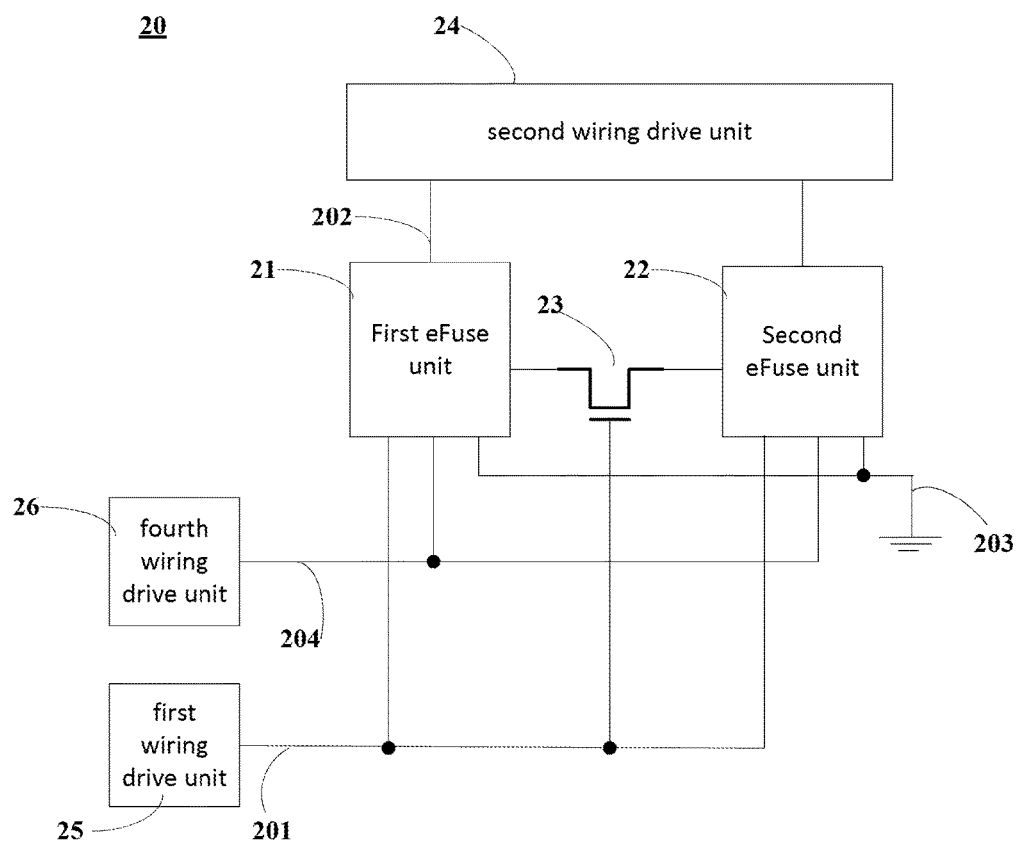
FIG. 2A is a simplified schematic block diagram illustrating an array of electrical programmable fuse or electrical fuse (eFuse) cells according to some embodiments of the present invention.

FIG. 2A is a simplified schematic diagram illustrating an array 20 of electrical programmable fuse or electrical fuse (eFuse) cells according to some embodiments of the present invention. Array 20 may include a first wiring 201 (e.g., the first wiring may be used as a write word line), a plurality of eFuse units connected to the first wiring (e.g., a first eFuse unit 21 and a second eFuse unit 22), and at least one connecting switch (e.g., NMOS transistor) 23.

Figure 2B:
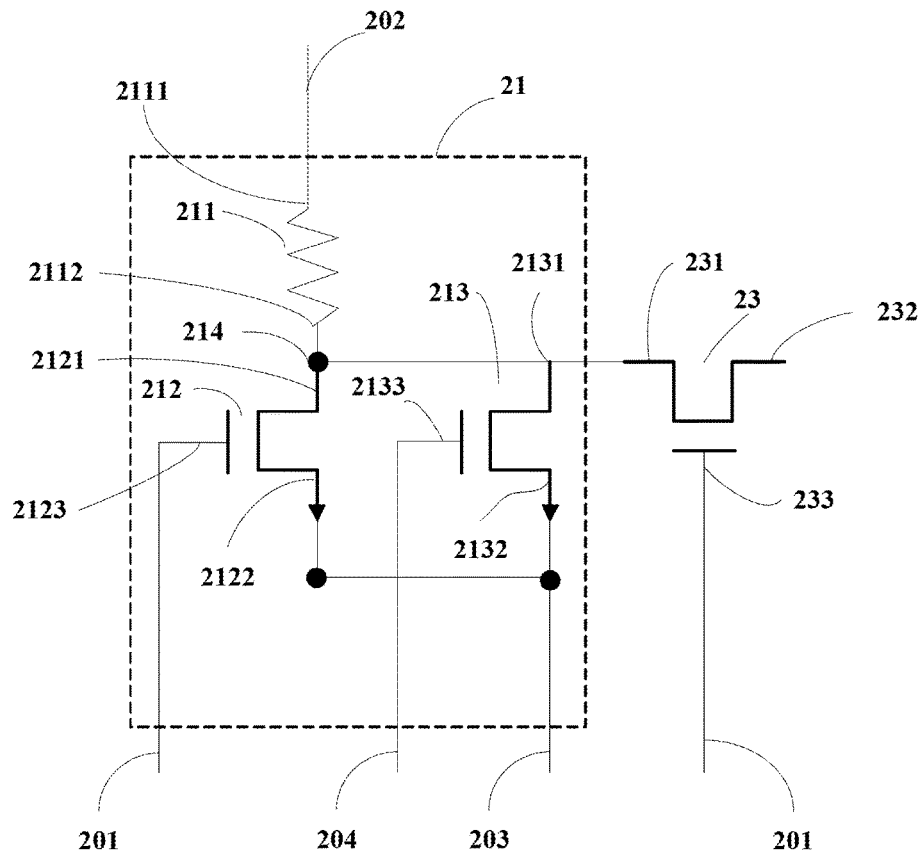
FIG. 2B is an enlarged portion of the schematic diagram of the eFuse cell array of FIG. 2A.

FIG. 2B is an enlarged portion of the schematic diagram of the eFuse cell array of FIG. 2A. Second eFuse unit 22 may have a similar or the same structure as first eFuse unit 21. Referring to FIG. 2B, each of the eFuse unit (e.g., first eFuse unit 21) may include an eFuse 211, a write switch 212 for write operations (e.g., an NMOS transistor for the write operations, which is referred to as a write NMOS transistor hereinafter), a read/write switch 213 for read/write operations (e.g., an NMOS transistor for the read or write operations, which is also referred to as a read/write NMOS transistor hereinafter), and a common node 214 connecting eFuse 211, write NMOS transistor 212 and read/write NMOS transistor 213. EFuse 211 includes a first terminal 2111 and a second terminal 2112. Write switch 212 includes a first terminal 2121 (e.g., a drain of the write NMOS transistor), a second terminal 2122 (e.g., a source of the write NMOS transistor), and a control terminal 2123 (e.g., a gate of the write NMOS transistor). The write switch allows a portion of a write current of the eFuse to flow therethrough. Read/write switch 213 includes a first terminal 2131 (e.g., a drain of the read/write NMOS transistor), a second terminal 2132 (e.g., a source of the read/write NMOS transistor), and a control terminal 2133 (e.g., a gate of the read/write NMOS transistor). The read/write switch allows a portion of a write current of the eFuse to flow therethrough or a read current of the eFuse to flow therethrough.

EFuse 211 includes a first terminal 2111 connected to a second wiring 202 (e.g., a bit line configured to receive a high voltage potential for read/write operations). EFuse 211 also includes a second terminal 2112 connected to first terminal 2121 of write switch 212 and first terminal 2131 of read/write switch 213 at a common node 214. Second terminal 2122 of write switch 212 and second terminal 2132 of read/write switch 213 are connected to a third wiring 203, e.g., the third wiring is connected to a low voltage potential, such as ground. Control terminal 2123 of write switch 212 is connected to first wiring 201, and control terminal 2133 of read/write switch 213 is connected to fourth wiring 204.

In a preferred embodiment, control terminal 233 of connecting switch 23 is connected to first wiring 201, however, the control terminal is not limited to this. For example, control terminal 233 of connecting switch 23 may be connected to other wirings. Connecting switch 23 is disposed between two adjacent eFuse units (e.g., first eFuse unit 21 and second eFuse unit 22) that are connected to first wiring 201. Connecting switch 23 is configured to connect to the common node of each of two adjacent eFuse units, e.g., connecting switch has a terminal connected to common node 214 of first eFuse unit 21 and a common node of second eFuse unit 22 (not shown in FIGS. 2A and 2B). For example, connecting switch 23 has a first terminal 231 connected to common node 214 of first eFuse 21 and a second terminal 232 connected to a common mode of second eFuse 22.

In other words, in the exemplary embodiment, the plurality of eFuse units includes two eFuse units, and at least one connecting switch disposed therebetween.

In some embodiment of the present invention, the write switch, the read/write switch, and the connecting switch may be NMOS transistors, as shown in FIG. 2B. However, it is to be understood that, in other embodiments, the write switch, the read/write switch, and the connecting switch may be implemented using other electronic switching elements, such as PMOS transistors. It will be appreciated by those of skill in the art that, if the write switch, the read/write switch, and the connecting switch are made of PMOS transistors, the PMOS transistors are disposed at the high voltage potential with regard to the eFuse.

FIG. 2A shows an array of eFuse units arranged in 1 row by 2 columns. In some embodiments, the array of eFuse units may be arranged in X rows and Y columns, where X and Y are natural numbers, and Y is greater than 2. In a preferred embodiment, Y is Nth power of 2 ($2^N$), where N is a natural number.

In an exemplary embodiment, array 20 may also include a plurality of wiring drive units, e.g., a second wiring drive unit 24 configured to provide a write current and a read current. For example, in a write operation, second wiring drive unit 24 provides a high voltage potential and a write current to a selected second wiring (e.g., second wiring 202) for the write operation; and in a read operation, second wiring drive unit 24 provides to the selected wiring (e.g., second wiring 202) a high voltage potential and a read current for the read operation.

In the embodiment, array 20 may further include a first wiring drive unit 25 configured to provide a driving voltage to a selected first wiring. For example, referring to FIG. 2A, first wiring drive unit 25 may provide a high voltage level as a drive voltage to turn on the write switch connected to the first wiring and the connecting switch.

In the embodiment, array 20 may further include a fourth wiring drive unit 26 configured to provide a driving voltage to a selected fourth wiring. Referring to FIG. 2A, fourth wiring drive unit 26 may provide a high voltage level as a drive voltage to turn on the write switch connected to the fourth wiring and the read/write switch. Although first wiring drive units 25 and 26 are shown as separate units in FIG. 2A, it should be understood that they may be integrally integrated in a drive unit.

In the embodiment, in a write operation, an appropriate voltage level is applied to the first wiring, the second wiring electrically connected to a selected eFuse, the third wiring, and the fourth wiring of the eFuse unit to turn on the write switch, the read/write switch, and at least the connecting switch associated with the eFuse unit, so that the write current flows through the selected eFuse of the eFuse unit. Specifically, as shown in FIGS. 2A and 2B, in a write operation, first wiring 201, selected second wiring 202, and fourth wiring 204 are at a high level (it is noted that it is not necessary that the wirings are to be at the same high level), third wiring 203 is at ground, so that the write switch, read/write switch and connecting switch of the eFuse unit of the array are turned on, and so that the write current flows through the selected eFuse of the eFuse unit (e.g., first eFuse 211 of eFuse unit 21) to perform a write (programming) operation to the selected eFuse.

In the embodiment, in a read operation, the first wiring, the second wiring electrically connected to the eFuse, the third wiring, and the fourth wiring each have an appropriate voltage level, so that the write switch of the selected eFuse is turned off and the read/write switch is turned on, the at least one connecting switch is turned off, so that the read current flows through the eFuse. Specifically, as shown in FIGS. 2A and 2B, in a read operation, first wiring 201 is at a low level, selected second wiring 202 is at a high level, and third and fourth wirings 203 and 204 are at a high level, so that the write switch (e.g., write switch 212) of the selected eFuse unit (e.g., first eFuse unit 21) is turned off, the read/write switch (e.g., read/write switch 213) is turned on, and the connecting switch (e.g., connecting switch 23) is turned off, so that the read current flows through the eFuse of the selected eFuse unit (e.g., eFuse 211).

In the embodiment, the read current is significantly smaller than the write current, for example, the write current is at least 10 times greater than the read current, preferably 100 times greater than the read current. In the following description, it is assumed that the write current is 100 units, the maximum read current is about 10 units without causing damage to the eFuse, while the nominal read current is 1 unit. Since the read current is less than (or even much less than) the maximum read current in the read operation, it is possible to significantly increase the number of read operations without causing damage to the eFuse unit. On the other hand, since a very small read current is used, the switching device (e.g., transistor) as the read switch can have a reduced area. For example, the switching transistor can be designed as the read/write switch using the minimum feature size permissible for that manufacturing process.

Furthermore, in the eFuse array of the embodiment, additional connecting switches may be added between two adjacent eFuse units that are connected to the same first wiring. In a write operation, the write switch and the read/write switch of the eFuse unit are turned on, and the connecting switch between the two adjacent eFuse units is turned on, so that the write current of the selected eFuse unit flows through the write switch and the read/write switch of the eFuse units connected to the first wiring (i.e., the same row of the eFuse array).

In the case where a multitude of eFuse units are connected to the same first wiring (i.e., the same row of the array), a number of switches may be added to two adjacent eFuse units connected to the first wiring. Ideally, the write current of the selected eFuse unit flows through the write switch and read/write switch of all of the eFuse units in the same row (through the connecting switches). Since the write current splits between multiple switches, the size of each of the switches can be reduced. Although the number of connecting switches increases, the overall area of the eFuse array is reduced.

The following description will be illustrated with reference to FIGS. 2A and 2B. In the following description, it is assumed that the write current is 100 units, the nominal read current for a read operation is 1 unit. Herein, for ease of illustration, assuming that the process conditions are the same and the gate widths are different, the current flowing through the MOS transistors, the on-resistance, and the area have a linear relationship. Specifically, assuming the current flowing through the MOS transistors and the on-resistance are inversely proportional, and the area of the MOS transistor and its on-resistance are also approximately inversely proportional. Accordingly, the current flowing through the MOS transistor is proportional to its area.

When a write (programming) operation is performed on the first eFuse (i.e., eFuse 211) of the first eFuse unit 21, the write switch of first eFuse unit 21 and the write switch of second eFuse unit 22 are turned on, the connecting switch 23 is turned on, at this time, the write switches of respective first and second eFuse units 21, 22, and the connecting switch are switched in parallel, so that the first equivalent on-resistance $R_{on1}$ is obtained with the following equation:

$$R_{on1} = \frac{1}{\frac{1}{R_{w1}} + \frac{1}{R_{r1}} + \frac{1}{R_{AN} + \frac{1}{\frac{1}{R_{w2}} + \frac{1}{R_{r2}}}}}$$

where $R_{w1}$ is the on-resistance of the write switch of first eFuse unit 21, $R_{r1}$ is the on-resistance of the read/write switch of first eFuse unit 21, $R_{AN}$ is the on-resistance of connecting switch 23, $R_{W2}$ is the on-resistance of the write switch of second eFuse unit 22, and $R_{r2}$ is the on-resistance of the read/write switch of second eFuse unit 22.

When a write operation is performed on the eFuse of second eFuse unit 22, the write switch of first eFuse unit 21 and the write switch of second eFuse unit 22 are turned on, the connecting switch 23 is turned on, at this time, the write switches of respective first and second eFuse units 21, 22, and the connecting switch are switched in parallel, so that the second equivalent on-resistance $R_{on2}$ is obtained with the following equation:

$$R_{on2} = \frac{1}{\frac{1}{R_{w2}} + \frac{1}{R_{r2}} + \frac{1}{R_{AN} + \frac{1}{\frac{1}{R_{w1}} + \frac{1}{R_{r1}}}}}$$

The on-resistance of the respective write switches, read/write switches, and connecting switches can be designed according to the desired equivalent on-resistance.

The percentage area savings of array 20 shown in FIG. 2A can be estimated as follows. Assuming the write current is 100 times the read current (i.e., the write current is assumed to be 100 units, the read current is assumed to be 1 unit. By way of example but not limitation, the write current is 100 mA, and the read current is 1 mA). Assuming further that, in the prior art shown in FIG. 1, the NMOS transistors for the write switch and read/write switch consume 80% of the eFuse unit area; and assuming further that the eFuse of the present invention and the conventional eFuse have the same size and have the same write current.

In a write operation, the portion of the write current flowing through the read/write switch of the conventional eFuse unit is 1 unit, and the portion of the write current flowing through the write switch of the conventional eFuse unit is 99 units, and the total write current is 100+1=100 units. Since the current flowing through the transistor is proportional to its area, the area of the read/write switch is 1 unit, and the area of the write switch is 99 units. It is understood that, as used herein, the term "unit" has no physical meaning, it is solely used to illustrate and facilitate the understanding of the present invention. For example, the read/write switch is designed with the minimum allowable dimension for a given process technology (e.g., the minimum size gate length for a given process) and a W/L ratio of 1, where the length of the gate is L=1 and the width of the gate is W, the corresponding W/L ratio of the write switch is thus 99, which is 99 times the area of the read/write switch. In the following description, the numerical value will be used without the corresponding unit.

In accordance with the present invention, two eFuse units are connected to the first wiring, and the connecting switch is disposed between the two eFuse units, as shown in FIG. 2A. The on-resistance (proportional to the corresponding area) of each write switch, read/write switch, and the connecting switch is designed such a way that the write current flows proportionally through the eFuse across each one of the read/write switch of first eFuse unit 21, write switch 212, connecting switch 23, and the read/write switch and the write switch of second eFuse unit 22, where the total area of each switch is optimized (minimum size).

In a preferred embodiment, read/write switch 213, write switch 212, connecting switch 23, and the read/write switch and the read switch of second eFuse unit 22 are designed to be 1 unit, 79 units, 30 units, 1 unit, and 79 units, respectively. Since the area of the transistor and the current through it have a positive correlation, so the corresponding area of the respective switches are 1 unit, 79 units, 30 units, 1 unit, and 79 units. It should be noted that, as described herein, the write current flowing through each of the switches should not be greater than the maximum allowed current for each individual switch. In general, with other parameters being the same, the larger the area (the larger the W/L), the larger is the allowed amount of current flowing through it.

Thus, compared to the eFuse unit of the prior art shown in FIG. 1, each of the eFuse unit in array 20 (e.g., eFuse unit 21 or eFuse unit 22) of the present invention may achieve the following area saving: each switch (read/write switch 213 (1 area unit), write switch 212 (79 area units), connecting switch 23 (30 area units), and the read/write switch (1 area unit) and the write switch (79 area units)), so that the total area is (1+79+30+1+79)/2=190/2=95 vs. 100 area units of the prior art eFuse. In other words, the eFuse of the present invention achieves an area saving of 5 area units. Accordingly, as the write switch and read/write switch consume 80% of the eFuse unit area, the percentage area saving is 80%×5 area units=4%. Thus, the eFuse unit of the embodiment shown in FIG. 2A achieves an area saving of 4% with respect to the prior art eFuse. With the increase of the number of columns of the array, the number of switches also increases, so that each switch can be designed with a smaller dimension. The higher the number of rows in an eFuse array, the more area can be saved.

Figure 3:
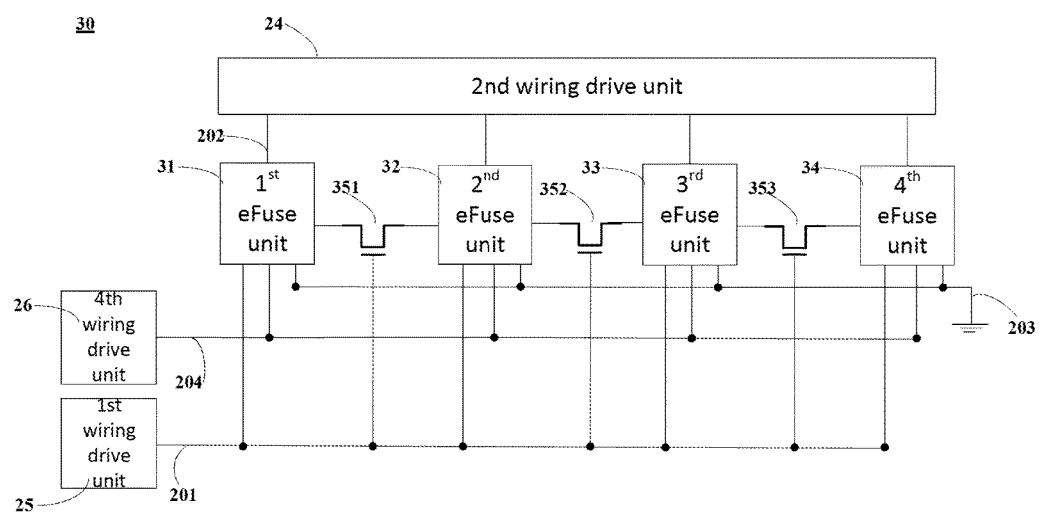
FIG. 3 is a simplified schematic block diagram illustrating an array of eFuse cells according to some other embodiments of the present invention.

FIG. 3 is a schematic block diagram of an eFuse array 30 according to other embodiments of the present invention. As shown in FIG. 3, array 30 may include four eFuse units, i.e., a first eFuse unit 31, a second eFuse unit 32, a third eFuse unit 33, and a fourth eFuse unit 34, which are connected to a second wiring drive unit 24. Array 30 also includes a first connecting switch 351 disposed between first and second eFuse units 31 and 32, a second connecting switch 352 disposed between second and third eFuse units 32 and 33, and a third connecting switch 353 disposed between third and fourth eFuse units 33 and 34. Array 30 further includes a first wiring drive unit 25 and a fourth wiring drive unit 26. Each of the first, second, third, and fourth eFuse units may have a circuit structure similar to that of FIG. 2B. That is, each of the first, second, third, and fourth eFuse units has a control terminal connected to first wiring drive unit 25 and a control terminal connected to fourth wiring drive unit 26. The configuration of FIG. 3 is similar to that of FIG. 2A, which has been described in detail in sections above.

Similarly, the write current of the read/write and write switches of first eFuse unit 31, connecting switch 351, second eFuse unit 32, connecting switch 352, third eFuse unit 33, connecting switch 353, and fourth eFuse unit 34 can be designed as 1 unit, 54 units, 39 units, 1 unit, 39 units, 50 units, 1 unit, 39 units, 39 units, 1 unit, and 54 units, respectively. The corresponding area of each of the switches is thus 1 unit, 54 units, 39 units, 1 unit, 39 units, 50 units, 1 unit, 39 units, 39 units, 1 unit, and 54 units, respectively.

Thus, the area saving for each of the eFuse unit is:

$$80\% \times [1-(1+54+39+1+39+50+1+39+39+1+54)/4/100] = 16.4\%.$$

In accordance with embodiments of the present invention, each eFuse unit may achieve an area saving of 16.4 percent with regard to the convention eFuse unit.

In a preferred embodiment, the area of the second connecting switch is the largest. Referring to FIG. 3, the second connecting switch is connecting switch 352 disposed between first connecting switch 351 and third connecting switch 353 sequentially in order from left to right along the direction of the first wiring. The area of first connecting switch 351 and third connecting switch 353 disposed on opposite sides of second connecting switch 352 is substantially equal to or smaller than the area of the second connecting switch.

Since the on-resistance of a transistor is inversely proportional to its area, so the on-resistance of the connecting switch disposed between the two adjacent connecting switches along the first wiring direction is the smallest, and the on-resistance of the two adjacent connecting switches on its opposite sides is equal to or greater than the on-resistance of the connecting switch disposed therebetween.

In a preferred embodiment, the area of the read/write switch of each of the eFuse units is the same (e.g., equal to 1 unit) and is smaller than the area of the write switch. Accordingly, the on-resistance of the read/write switch of each eFuse unit is substantially equal to or greater than the on-resistance of the write switch.

In a preferred embodiment, the area of the write switch of the outermost eFuse units (i.e., the first and fourth eFuse units 31, 34) is the largest, the area of the first and fourth write switches of the respective first and fourth eFuse units is 54 units. The area of the write switches of the eFuse units in the middle decreases, i.e., the area of the second and third write switches of the respective second and third eFuse units is 32 units. It is to be understood that the sequential order is from left to right.

Accordingly, since the on-resistance of a transistor is inversely proportionally to its area, the on-resistance of the write switch of the outermost eFuse units has the smallest value, and the on-resistance of the write switch of the eFuse units disposed between the outermost eFuse units increases.

Figure 4:
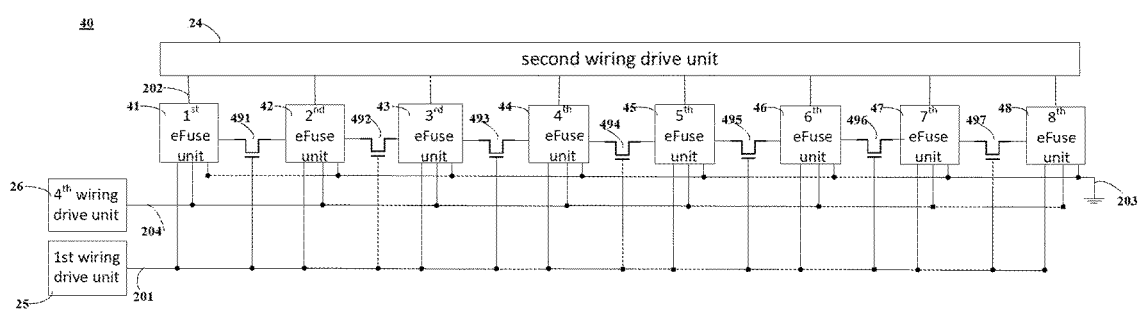
FIG. 4 is a simplified schematic diagram illustrating an array of eFuse cells according to yet other embodiments of the present invention.

FIG. 4 is a schematic block diagram of an eFuse array 40 according to yet other embodiments of the present invention. As shown in FIG. 4, array 40 may include eighth eFuse units, i.e., a first eFuse unit 41, a second eFuse unit 42, a third eFuse unit 43, a fourth eFuse unit 44, a fifth eFuse unit 41, a sixth eFuse unit 42, a seventh eFuse unit 43, an eighth eFuse unit 44, each of which is connected to a second wiring drive unit 24.

Array 40 also includes a first connecting switch 491 disposed between first and second eFuse units 41 and 42, a second connecting switch 492 disposed between second and third eFuse units 42 and 43, a third connecting switch 493 disposed between third and fourth eFuse units 43 and 44, a fourth connecting switch 494 disposed between fourth and fifth eFuse units 44 and 45, a fifth connecting switch 495 disposed between fifth and sixth eFuse units 45 and 46, a sixth connecting switch 493 disposed between sixth and seventh eFuse units 46 and 47, and a seventh connecting switch 497 disposed between seventh and eighth eFuse units 47 and 48. Array 40 further includes a first wiring drive unit 25 and a fourth wiring drive unit 26. Each of the first, second, third, fourth, fifth, sixth, seventh, and eighth eFuse units may have a circuit structure similar to that of FIG. 2B. That is, each of the first, second, third, fourth, fifth, sixth, seventh, and eighth eFuse units has a control terminal connected to first wiring drive unit 25 and a control terminal connected to fourth drive unit 26. The configuration of FIG. 4 is similar to those of FIG. 2A and FIG. 3, which have been described in detail in sections above, and will not be repeated herein for the sake of brevity.

Referring to FIG. 4, the write current of the read/write and write switches of first eFuse unit 41, connecting switch 491, second eFuse unit 42, connecting switch 492, third eFuse unit 43, connecting switch 493, fourth eFuse unit 44, connecting switch 494, fifth eFuse unit 45, connecting switch 495, sixth eFuse unit 46, connecting switch 496, seventh eFuse unit 47, connecting switch 497, and eighth eFuse unit 48 can be designed as 1 unit, 42 units, 40 units, 1 unit, 29 units, 35 units, 1 unit, 25 units, 35 units, 1 unit, 22 units, 40 units, 1 unit, 22 units, 35 units, 1 unit, 25 units, 35 units, 1 unit, 29 units, 40 units, 1 unit, and 42 units, respectively. The corresponding area of each of the switches are 1 unit, 42 units, 40 units, 1 unit, 29 units, 35 units, 1 unit, 25 units, 35 units, 1 unit, 22 units, 40 units, 1 unit, 22 units, 35 units, 1 unit, 25 units, 35 units, 1 unit, 29 units, 40 units, 1 unit, and 42 units, respectively.

Thus, the area saving for each of the eFuse unit is:

$$80\% \times [1-(1+42+40+1+29+35+1+25+35+1+22+40+1+22+35+1+25+35+1+29+40+1+42)/8/100] = 29.6\%.$$

In accordance with embodiments of the present invention, each eFuse unit may achieve an area saving of 29.6 percent with regard to the convention eFuse unit.

In a preferred embodiment, the area of the fourth connecting switch is the largest. Referring to FIG. 4, the fourth connecting switch is connecting switch 494 disposed between first connecting switch 491 and seventh connecting switch 487 sequentially from left to right along the direction of the first wiring. The area of first connecting switch 491 and seventh connecting switch 497 disposed on opposite sides of fourth connecting switch 494 is substantially equal to the area of fourth connecting switch 494. The area of the connecting switches disposed between the first and the fourth connecting switches decreases with respect to the area of the first and fourth connecting switches, i.e., the area of the second and third connecting switches decreases toward the midpoint of the first and fourth connecting switches. The area of the connecting switches disposed between the fourth and the seventh connecting switches decreases with respect to the area of the fourth and seventh connecting switches, i.e., the area of the fifth and sixth connecting switches decreases toward the midpoint of the fourth and seventh connecting switches. The area of the second, third, fifth, and sixth connecting switches is the smallest.

Since the on-resistance of a transistor is inversely proportional to its area, the on-resistance of the fourth connecting switch disposed in the middle of the connecting switches along the first wiring direction is the smallest, and the on-resistance of the first and seventh connecting switches disposed on its opposite sides is substantially equal to the on-resistance of the fourth connecting switch. The value of the on-resistance of the connecting switches disposed between the first and fourth connecting switches increases. The value of the on-resistance of the connecting switches disposed between the fourth and seventh connecting switches increases. The on-resistance of the second, third, fifth, and sixth connecting switches is the highest.

It can be seen from above, the area of the read/write switch of each eFuse unit is the same and is smaller than the area of the write switch of the eFuse unit. Correspondingly, the on-resistance of the read/write switch of each eFuse unit has substantially the same value and is larger than the on-resistance of the write switch of the eFuse unit.

In a preferred embodiment, sequentially from the first to the eighth write switch, the area of the write switch of the outermost eFuse units (i.e., the first and eighth eFuse units 41, 48) is the largest (42 units). The area of the write switches of the eFuse units toward the middle decreases, i.e., the area of the fourth and fifth write switches of the respective fourth and fifth eFuse units 44 and 45 is the smallest (22 units). It is to be understood that the sequential order is from left to right.

Accordingly, since the on-resistance of a transistor is inversely proportionally to its area, the on-resistance of the write switch of the outermost eFuse units has the smallest value, and the on-resistance of the write switch of the eFuse units disposed between the outermost eFuse units and toward the middle of the sequence of the eFuse units increases. The on-resistance of the two write switches in the middle of the sequence of the eFuse units, i.e., eFuse units 44 and 45, has the highest value.

Further, in the embodiment of the present invention, an array of eFuse units may include $2^N$ eFuse units, at least $2^N-1$ connecting switches, where N is an integer greater than 2. The $2^N-1$ connecting switches each are disposed between two adjacent eFuse units. In the sequence of connecting switches, the connecting switches disposed in the middle of the sequence $2^N-1$ have the largest area, and the outermost connecting switches, the first (1) and the last (i.e., $2^N-1$) connecting switches in the sequence have a substantially equal area. The area of the connecting switches disposed between the middle and the outermost position of the sequence decreases (e.g., the connecting switches between the $2^N-2$ and $2^{N-2}+1$ connecting switches). The area of the connecting switches disposed between the $2^N-1$ and the $2^{N-1}$ connecting switches decrease toward the middle of therebetween. Here, the middle of the sequence from $2^N-2^{N-2}-1$ and $2^N-2^{N-2}$ (respectively corresponding to the middle of the $2^N-2^{N-2}-1$ connecting switch and the $2^N-2^{N-2}$ connecting switch). In some embodiments, the area of the $2^{N-2}$ connecting switch and the $2^{N-2}+1$ connecting switch, and the $2^N-2^{N-2}-1$ connecting switch and $2^N-2N-2$ connecting switch is the smallest.

Since the on-resistance of a transistor is inversely proportional to its area, in the sequence of $2^N-1$ connecting switches, where N is a positive integer greater than 2, the on-resistance of the $2^{N-1}$ connecting switch is the smallest, and the on-resistance of the outermost first (1) and last $(2^N-1)$ connecting switches is substantially equal. The on-resistance of the connecting switches disposed between the first and the last connecting switches increases. Here, the middle of the sequence between the $2^{N-2}$ and $2^{N-2}+1$ (respectively corresponding to the middle of the $2^{N-2}$ connecting switch and the $2^{N-2}+1$ connecting switch). The on-resistance of the connecting switches disposed between the $2^N-1$ and the $2^{N-1}$ connecting switches increases. Here, the middle of the sequence between the $2^N-2^{N-2}-1$ and $2^N-2^{N-2}$ (respectively corresponding to the middle of the $2^N-2^{N-2}-1$ connecting switch and the $2N-2^{N-2}$ connecting switch). In some embodiments, the on-resistance of the $2^{N-2}$ and $2^{N-2}+1$ connecting switches and the $2^N-2^{N-2}-1$ and $2^N-2^{N-2}$ connecting switches is the highest.

It is to be understood that the above-described embodiments are merely exemplary, the area (dimension or on-resistance) of the switches can be properly designed according to desired application requirements.

In the embodiment of the present invention, the read/write switch of each eFuse unit may have a substantial equal area (dimension); the write switch of the eFuse unit has the smallest area. Accordingly, the on-resistance of the read/write switches is substantial the same, and is greater than the on-resistance of the write switches of the eFuse units.

In the embodiment of the present invention, the array of eFuse units may include $2^N$ eFuse units and $2^N$ corresponding write switches, where N is an integer greater than 1. In the sequence of the $2^N$ eFuse units, the outermost write switches, i.e., the first (1) write switch and the last $(2^N)$ write switch each have the largest area. The area of the write switches disposed between the first and last write switches decreases in size. The middle position is located at the $2^{N-1}$ (corresponding to the $2^{N-1}$ write switch) and the $2^{N-1}+1$ (corresponding to the $2^{N-1}+1$ write switch) positions of the sequence. In some embodiments, the two write switches disposed in the middle position of the sequence, (i.e., $2^{N-1}$ write switch and the $2^{N-1}+1$ write switch have the smallest area.

Accordingly, the sequence of the $2^N$ write switches, where N is a positive integer, the on-resistance of the outermost write switches, i.e., the first (1) and the last $(2^N)$, is the smallest. The on-resistance of the write switches disposed between the first and last write switches and toward the middle increases. In some embodiments, the two write switches disposed in the vicinity of the middle of the sequence, i.e., the $2^{N-1}$ write switch and the $2^{N-1}+1$ write switch, have the largest on-resistance.

In accordance with the present invention, a connecting switch is disposed between two adjacent eFuse units; in a write operation, the write current can flow through a plurality of write switches and read/write switches, thereby decreasing the amount of the write current flowing through the switches. Thus, the area of a switch (e.g., a transistor) can be reduced, thereby reducing the total area of the array of the eFuse units. Furthermore, embodiments of the present invention can maintain the total equivalent on-resistance of the different eFuse units in a write operation, so that the write current flowing through the different eFuse units has the same amount, which in turn can improve the stability and reliability of the device.

Although the above-described embodiments use an array having one row of $2^N$ eFuse units, where N is a natural number, as an illustration example, those of skill in the art will appreciate that the teachings of the invention can apply to any number of rows.

Figure 5:
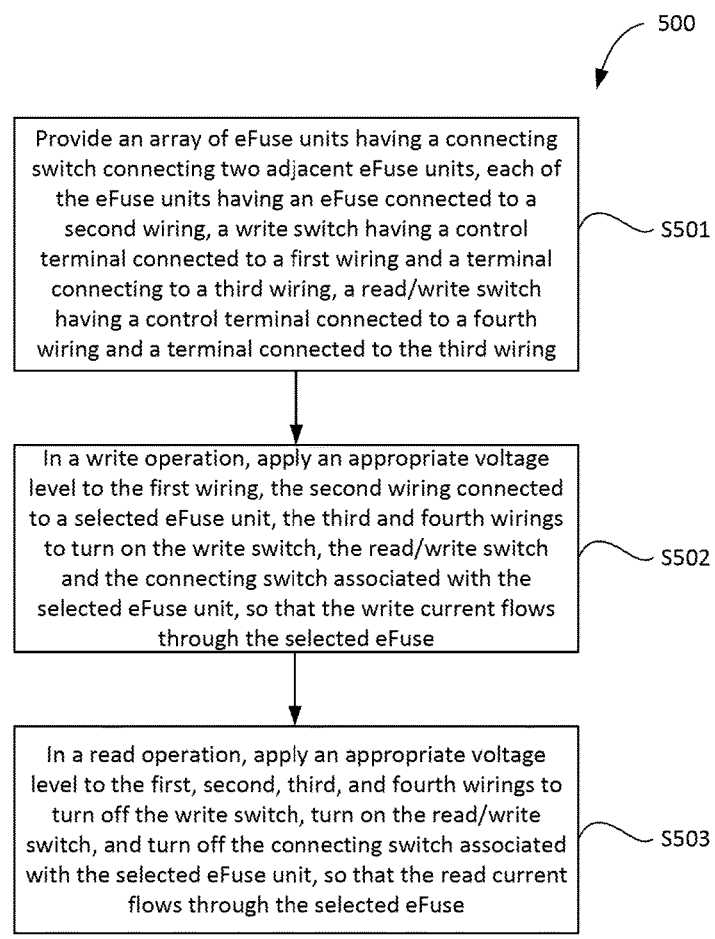
FIG. 5 is a simplified flowchart of a method for operating an array of eFuse cells according to some embodiments of the present invention.

FIG. 5 is a flowchart of a method for operating an array of eFuse units according to some embodiments of the present invention. Referring to FIG. 5, method 500 includes the following steps:

S501: provide an array of eFuse units, such as an eFuse array having the configuration 20, 30, or 40, as shown in FIG. 2A, 3, or 4. For example, the eFuse array includes a connecting switch connected between two adjacent eFuse unit, a first wiring unit having at least one first wiring, a second wiring unit having multiple second wirings, and a fourth wiring unit having at least one fourth wiring. The eFuse array also includes a third wiring. Each eFuse unit may include an eFuse connected to a second wiring, a write switch having a control terminal connected to a first wring and a terminal connected to the third wiring, and a read/write switch having a control terminal connected to a fourth wiring and a terminal connected to the third wiring.

S502: in a write operation, apply an appropriate voltage level to the first wiring, to a second wiring connected to a selected eFuse unit, and to the third and fourth wirings to turn on the write switches, read/write switches, and the connecting switches corresponding a number of eFuse units connected in a same row, so that a write current flows through the eFuse of the selected eFuse unit.

S503: in a read operation, apply an appropriate voltage level to the first, second, third, and fourth wirings to turn off the write switch, turn on the read/write switch, and turn off the associate connecting switch, to cause the write current to flow through the eFuse of the selected eFuse unit.

Those of skill in the art would appreciate that the above-described sequence of steps of the method is for the purpose of illustration only, the steps of the method of the present invention are, however, not limited to the specific order described above, unless specifically stated otherwise. It is to be understood to those of skill in the art that features of the above-described embodiments can be combined with each other in various combinations or permutations.

Although certain embodiments of the present invention are described in detail, those skilled in the art will appreciate that the above examples are for illustration only and not to limit the scope of the invention. Thus, those skilled in the art would appreciate that, aside from embodiments of the present disclosure, various modifications and changes can be made without departing from the spirit and scope of the present disclosure. The scope of the invention should be determined with reference to the appended claims, along with the full scope of equivalents to which such claims are entitled.

What is claimed is:

1. An array of electrically programmable fuse (eFuse) units, the array comprising:
   a first wiring drive unit configured to provide a first wiring;
   a plurality of eFuse units connected to the first wiring, each of the eFuse units comprising:
      an electrically programmable fuse (eFuse) having a first terminal and a second terminal;
      a write switch having a first terminal, a second terminal, and a control terminal, the write switch being configured to pass through a first portion of a write current;
      a read/write switch having a first terminal, a second terminal, and a control terminal, the read/write switch being configured to pass through a second portion of the write current or a read current;
      a common node; wherein:
      the first terminal of the eFuse is connected to a second wiring,
      the second terminal of the eFuse, the first terminal of the read/write switch, and the first terminal of the write switch are connected to the common node,
      the second terminal of the write switch and the second terminal of the read/write switch is connected to a third wiring,
      the control terminal of the write switch is connected to the first wiring,
      the control terminal of the read/write switch is connected to a fourth wiring, and
   at least one connecting switch having a control terminal connected to the first wiring, the at least one connecting switch being disposed between two adjacent eFuse units and a first terminal connected to a common node of a first of the two adjacent eFuse units and a second terminal connected to a common node of a second of the two adjacent eFuse units.

2. The array of claim 1, wherein the plurality of eFuse units comprise two eFuse units, the at least one connecting switch comprises one connecting switch, and the one connecting switch is disposed between the two eFuse units.

3. The array of claim 1, wherein the plurality of eFuse units comprise four eFuse units, the at least one connecting switch comprises three connecting switches, and the three connecting switches are disposed alternatively between the four eFuse units.

4. The array of claim 1, wherein the plurality of eFuse units comprise $2^N$ eFuse units, the at least one connecting switch comprises $2^N-1$ connecting switches, N being a positive integer greater than 2; and the $2^N-1$ connecting switches are disposed alternatively between the $2^N$ eFuse units;
   in a sequence of $2^N-1$ connecting switches:
   a connecting switch at a location $2^{N-1}$ has a smallest on-resistance value, and a first connecting switch and a last connection switch each have a substantially equal on-resistance value;
   connecting switches disposed between the first and last connecting switches and toward a middle of the sequence have an increasing on-resistance value; and
   connecting switches disposed between a $2^{N-1}$ positioned connecting switch and a $2^{N-1}$ positioned connecting switch have an increasing on-resistance value.

5. The array of claim 4, wherein a $2^N-2$ positioned connecting switch, a $2^{N-2}+1$ positioned connecting switch, a $2^N-2^{N-2}-1$ positioned connecting switch, and a $2^N-2^{N-2}$ positioned connecting switch, each have a largest on-resistance value.

6. The array of claim 1, wherein the read/write switch of each one of the eFuse units has a substantial same on-resistance value, which is greater than an on-resistance value of the write switch of each one of the eFuse units.

7. The array of claim 1, wherein the plurality of eFuse units comprise $2^N$ eFuse units, and $2^N$ write switches, each of which corresponding to one of the $2^N$ eFuse units, N being a positive integer greater than 1;

in a sequence of $2^N$ write switches:
a first write switch and a last write switch at outermost ends of the sequence each have a smallest on-resistance value;
write switches each disposed between the first and last write switches and toward a middle of the sequence have an increasing on-resistance value.

8. The array of claim 1, wherein the plurality of eFuse units comprise four eFuse units, the at least one connecting switch comprises three connecting switches, and the three connecting switches are disposed alternatively between the four eFuse units;

in a sequence of the three connecting switches:
a connecting switch in a middle of the sequence has a greatest area;
the two connecting switches each disposed at an outermost end of the sequence have a substantial same area, which is smaller than an area of a connecting switch in the middle of the sequence.

9. The array of claim 1, wherein the plurality of eFuse units comprise $2^N$ eFuse units, the at least one connecting switch comprises $2^N-1$ connecting switches, N being a positive integer greater than 2; the $2^N-1$ connecting switches are disposed alternatively between the $2^N$ eFuse units;

in a sequence of $2^N-1$ connecting switches:
a connecting switch at a location $2^{N-1}$ has a largest area, and a first connecting switch and a last connection switch at outermost ends of the sequence have a substantially equal area;
connecting switches disposed between the first and last connecting switches and toward a middle of the sequence have a decreasing area;
connecting switches disposed between a $2^{N-1}$ positioned connecting switch and a $2^{N-1}$ positioned connecting switch have a decreasing area.

10. The array of claim 9, wherein a $2^N-2$ positioned connecting switch, a $2^{N-2}+1$ positioned connecting switch, a $2^N-2^{N-2}-1$ positioned connecting switch, and a $2^N-2^{N-2}$ positioned connecting switch each have a smallest area.

11. The array of claim 1, wherein each read/write switch of each one of the eFuse units has a substantial same area, which is smaller than an area of a write switch of each one of the eFuse units.

12. The array of claim 1, wherein the plurality of eFuse units comprise $2^N$ eFuse units, and $2^N$ write switches, each of which corresponding to each one of the $2^N$ eFuse units, N being a positive integer greater than 1;

in a sequence of $2^N$ write switches:
a first write switch and a last write switch at outermost ends of the sequence have a largest area;
write switches disposed between the first and last write switches and toward a middle of the sequence each have a decreasing area.

13. The array of claim 1, wherein the write switch, the read/write switch, and the at least one connecting switch are NMOS transistors.

14. The array of claim 1, further comprising:
a second wiring drive unit configured to provide a read current and a write current.

15. A method of operating an array of electrically programmable fuse (eFuse) units, the method comprising:
providing the array of a plurality of eFuse units having at least one connecting switch disposed between two adjacent eFuse units, each of the eFuse units being connected to a first wiring, a second wiring, a third wiring, and a fourth wiring, and each of the eFuse units having an eFuse connected to a write switch and a read/write switch;
in a write operation, applying a voltage level to the first, second, third, and fourth wirings to turn on the write switch, the read/write switch, and the at least one connecting switch, to cause a write current flowing through the eFuse of a selected eFuse unit;
in a read operation, applying a voltage level to the first, second, third, and fourth wirings to turn off the write switch, turn off the at least one connecting switch, and turn on the read/write switch, to cause a read current flowing through the eFuse of the selected eFuse unit.

* * * * *